United States Patent [19]

Dimitri

[11] Patent Number: 5,521,597
[45] Date of Patent: May 28, 1996

[54] DATA COMPRESSION FOR NETWORK TRANSPORT

[75] Inventor: Thomas J. Dimitri, Bellevue, Wash.

[73] Assignee: Mircosoft Corporation, Redmond, Wash.

[21] Appl. No.: 100,668

[22] Filed: Aug. 2, 1993

[51] Int. Cl.[6] .................................................. H03M 7/30
[52] U.S. Cl. ........................ 341/51; 341/87; 364/DIG. 1
[58] Field of Search ........................................ 341/31, 87

[56] References Cited

U.S. PATENT DOCUMENTS

| | | | |
|---|---|---|---|
| 4,021,782 | 5/1977 | Hoerning | 340/172.5 |
| 4,464,650 | 8/1984 | Eastman et al. | 340/347 DD |
| 4,701,745 | 10/1987 | Waterworth | 340/347 DD |
| 4,730,348 | 3/1988 | MacCrisken | 375/122 |
| 4,906,991 | 3/1990 | Fiala et al. | 341/51 |
| 5,003,307 | 3/1991 | Whiting et al. | 341/51 |
| 5,016,009 | 5/1991 | Whiting et al. | 341/67 |
| 5,046,027 | 9/1991 | Taaffe et al. | 364/521 |
| 5,058,144 | 10/1991 | Fiala et al. | 375/122 |
| 5,155,484 | 10/1992 | Chambers, IV | 341/55 |

FOREIGN PATENT DOCUMENTS

| | | | |
|---|---|---|---|
| WO92/02989 | 2/1992 | WIPO | H03M 7/42 |
| WO94/09567 | 4/1994 | WIPO | H03M 7/40 |

OTHER PUBLICATIONS

Bell, Timothy, et al., *Text Compression*, Prentice Hall, New Jersey, 1990, pp. 214–243, 303–310.

Fenwick, Ziv–Lempel encoding with multi–bit flags, ©1993 IEEE, 0–8186–3392–Jan./1993, pp. 138–147.

Freed et al., Pc Magazine Guide to Modem Communication, 1992, pp. 189–198.

Bell, Timothy, "Longest Match String Searching for Ziv–Lempel Compression," Submitted to Workshop on Algorithms and Data Structures, Carleton University, Canada, 1989.

Bell, Timothy, "A Unifying Theory and Improvements for Existing Approaches to Text Compression," doctoral dissertation, University of Canterbury, Christchurch, New Zealand, 1986.

Bell, Timothy, "Better OPM/L Text Compression," *IEEE Transactions on Communications*, vol. 34, No. 12, Dec. 1986, pp. 1176–1182.

Bell, Timothy, et al., "Modeling for Text Compression," *ACM Computing Surveys*, vol. 21, No. 4, Dec. 1989, pp. 557–591.

Brent, R. P., "A Linear Algorithm for Data Compression," *The Australian Computer Journal*, vol. 19, No. 2, May 1987, pp. 64–68.

(List continued on next page.)

*Primary Examiner*—Howard L. Williams
*Attorney, Agent, or Firm*—Seed and Berry

[57] ABSTRACT

Disclosed is a method and system for data compression. In a preferred embodiment, an input stream of data bytes are compressed into an encoded stream using an LZ77-based scheme. The preferred method searches for a matching sequence of already processed data bytes that is identical to a current sequence of bytes. Sequences of literals (bytes not forming part of a matching sequence) or match codes (encoded matching sequences) are identified by count values indicating the number of literals or match codes in the sequence. Preferably, the encoded stream is transmitted from a first computer to a second computer, where the encoded stream is decompressed. The method uses matching circular history buffers for compression and decompression, the history buffers being synchronized using a coherency byte included with each frame of encoded data transmitted. If an encoded frame is not received by the decompression device, the decompression device transmits a flush request to the compression device. The compression device flushes its history buffer in response to the flush request, the flushing step making the previously processed bytes stored in the history buffer incapable of becoming part of a matching sequence. The compression device includes in the coherency code of the next encoded frame a control code indicating whether a flush request has been received by the compression device.

37 Claims, 7 Drawing Sheets

OTHER PUBLICATIONS

Chambers, Lloyd, "Fast Data Compressor With Direct Lookup Table Indexing Into History Buffer," Software Source Code Appendix, Salient Software, Inc., 1991, pp. A1–A10.

Cleary, John G., and Witten, Ian H., "Data Compression Using Adaptive Coding and Partial String Matching," *IEEE Transactions on Communcations*, vol. 32, No. 4, Apr. 1984, pp. 396–402.

Fiala, Edward R., and Greene, Daniel H., "Data Compression With Finite Windows," *Communcations of the ACM*, vol. 32, No. 4, Apr. 1989, pp. 490–505.

Fiala, Edward R., Greene, Daniel H., "Compressimpl.mesa" and Compressimpl4KUF.mesa, Xerox Corp., 1984, pp. 1–18.

Horspool, R. Nigel, and Cormack, Gordon V., "A General–Purpose Data Compression Technique With Practical Computer Applications," *CIPS Session 84*, 1984, pp. 138–141.

Lempel, Abraham, and Ziv, Jacob, "On the Complexity of Finite Sequences," *IEEE Transactions on Information Theory*, vol. 22, No. 1, Jan. 1976, pp. 75–81.

Storer, James A., and Szymanski, Thomas G., "The Macro Model for Data Compression," *Tenth Annual ACM Symposium on Theory of Computer*, 1978, pp. 30–39.

Welch, Terry A., "A Techinque for High–Performance Data Compression," *Computer*, Jun. 1984, pp. 8–19.

Ziv, Jacob, "Coding Theorems for Individual Sequences," *IEEE Transactions on Information Theory*, vol. 24, No. 4, Jul. 1978, pp. 405–412.

Witten, Ian H., et al., "Compress and Compact Discussed Further," *Communications of the ACM, Technical Correspondence*, vol. 31, No. 9, Sep. 1988, pp. 1139–1140, 1145.

Ziv, Jacob, "On Universal Quantization," *IEEE Transactions on Information Theory*, vol. 31, No. 3, May 1985, pp. 344–347.

Ziv, Jacob, and Lempel, Abraham, "A Universal Algorithm for Sequential Data Compression," *IEEE Transactions on Information Theory*, vol. 23, No. 3, May 1977, pp. 337–343.

James A. Storer et al., "Data Compression via Textual Substitution," *Journal of the Association for Computing Machinery*, vol. 29, No. 4, Oct. 1982, pp. 928–951.

V. Jacobson, "Compressing TCP/IP Headers for Low–Speed Serial Links." *RFC1144*, Feb. 1990, pp. 1–43.

DATA COMPRESSION FOR NETWORK TRANSPORT

TECHNICAL FIELD

This invention relates generally to a method and system for data compression, and more particularly to a method and system for compressing data using LZ77-based compression in an inter-computer communication environment.

BACKGROUND OF THE INVENTION

A variety of data compression algorithms derive from work published in Ziv, Jacob and Lempel, Abraham, "A Universal Algorithm for Sequential Data Compression," *IEEE Transactions on Information Theory* 23(3) :337–343, May 1977. These algorithms are commonly referred to as LZ77compression schemes. LZ77 compression schemes are based on the principle that repeated strings of characters can be replaced by a pointer to the earlier occurrence of the string. A pointer is typically represented by an indication of the position of the earlier occurrence (typically an offset from the start of the repeated string) and the number of characters that match (the length). The pointers are typically represented as <offset, length> pairs. For example, the following string "abcdabcdacdacdacdaeaaaaaa"

may be represented in compressed form by the following

"abcd<4,5><3,9>ea<1,5 >"

Since the first characters "abcd" do not match any previous character, they are output in uncompressed form as literals. The pair <4,5>indicates that the string starting at an offset of 4 and extending for 5 characters is repeated "abcda". The pair <3,9> indicates that the string starting at an offset of 3 and extending for 9 characters is repeated. The "ea" are output as literals and the pair <1,5> indicate a string starting at an offset of 1 and extending for 5 characters ("aaaaa").

Compression is achieved by representing the repeated strings as a pointer with fewer bits than it would take to repeat the string. Typically, an unmatched single byte, known as a literal, is not represented as a pointer. Rather, literals are output with a flag indicating literal encoding followed by the byte itself. A pointer is typically differentiated from a literal encoding by a different flag that is followed by the offset and length. The offset and length can be encoded in a variety of ways. By adding a flag to each literal and each pointer, the prior art LZ-based systems provide less than optimal compression and may even cause expansion.

The great majority of prior art compression systems are directed to compression of data stored in a single medium, such as a floppy disk or computer hard drive. However, very little work has been in the area of lossless generic data compression over an unreliable link, such as in a network or modem communication. In such instances, the compressor and decompressor are physically detached and any information the compressor sends the decompressor might be lost along the way.

Modern networks operate in layers. At one of the higher layers of a network, a redirector or requestor may transmit blocks of homogeneous data, such as a database or a file. The data blocks typically are sent to a transport layer that breaks the data blocks into packets of limited size, such as 1.5 kilobytes(K) or less. The transport then adds transport headers to the packets and sends the packets to a Media Access Controller (MAC) that adds frame headers to the packets to form frames that are transmitted across the network. Although the packets sent from the transport often are consecutive portions of a single data block, the transport might send packets from two or more blocks stored in different buffer if there are two different sends simultaneously outstanding.

Given the homogeneity of the data at the transport layer, optimum compression may be obtained by enabling the transport to compress the data. However, transports are very complicated and need to interface with existing operating systems, such as DOS, Windows, OS/2, and UNIX so the task of creating a new transport with compression is very large. Further, existing transports are already widely used, so creating a new transport would not automatically provide compression to the many users of existing transports.

Some developers have attempted to employ compression at the MAC level. Some efforts are limited to compressing the transport header for each packet. Others compress the data in each packet, but compress each packet separately without using the data in previous frames. No known prior art system compresses frames based on the data in previous frames over an unreliable link. Further, no known prior art system employs LZ77-based compression to compress frames being sent across an unreliable communication link.

SUMMARY OF THE INVENTION

It is an object of the present invention to provide a method and system for compressing an input stream of data using an LZ77-based scheme.

It is another object of the present invention to provide a method and system for compressing an input stream in a first computer, transmitting the compressed input stream to a second computer, and decompressing the compressed stream in the second computer.

These and other objects of the present invention, which will become apparent as the invention is more fully described below, are provided by method and system for data compression. In a preferred embodiment, an input stream of data bytes are compressed into an encoded stream using an LZ77-based scheme. The preferred method searches for a matching sequence of already processed data bytes that is identical to a current sequence of bytes. Each data byte not forming part of such an identical sequence is appended to the encoded stream, such data byte being a literal. When a matching sequence is found, the method appends to the encoded data stream a match code that identifies both the location in the input stream of the matching sequence and the number of data bytes in the matching sequence. The method identifies a sequence of a predetermined number of literals in the encoded data stream and appends to the identified literal sequence a count value indicating the number of literals in the identified sequence. The method identifies a sequence of a predetermined number of match codes in the encoded data stream and appends to the identified match code sequence a count value indicating the number of match codes in the identified match code sequence.

Preferably, the input stream is stored in a circular history buffer of a compression device. The method divides the encoded data stream into a plurality of encoded frames and appends a coherency code to each encoded frame. The method transmits each encoded frame to a remote decompression device having a circular history buffer for decompressing each encoded frame. The method uses the coherency codes to synchronize the history buffer of the decompression device with the history buffer of the compression device. If an encoded frame is not received by the decompression device, the decompression device transmits a flush request to the compression device. The compression device flushes the history buffer in response to the flush request, the flushing step making the previously processed bytes stored in the history buffer incapable of becoming part of a matching sequence. The compression device includes in the coherency code of the next encoded frame a control code indicating whether a flush request has been received by the compression device.

In a preferred embodiment, the decompression device decompresses the encoded data stream into a decompressed stream identical to the input stream. The decompressing step includes locating a match count value, decoding a number of match codes equal to the match count value, and appending the decoded match codes to the decompressed stream. The decompression step also includes locating a literal count value and appending to the decompressed stream a number of literals equal to the literal count value.

DETAILED DESCRIPTION OF THE INVENTION

The present invention provides a method and system for compressing an input stream of data into a compressed stream of data using an LZ77-based encoding. The present invention also provides a method and system for decompressing the compressed stream to create a decompressed stream that is identical to the input stream. In a preferred embodiment, the input stream is inserted sequentially into a circular history buffer after each byte is analyzed. The compression system searches the history buffer to determine whether it contains a previous occurrence of a byte sequence that matches the current byte sequence. If the history buffer contains such a matching byte sequence, the compression system encodes the current byte sequence as a pointer to the matching byte sequence and the length of the match together with a match flag indicating that the encoding represents a matched sequence. When the history buffer does not contain such a matching sequence, the compression system outputs the first byte of the current byte sequence together with a literal flag indicating that the byte is an unmatched literal byte. Preferably, the compression system identifies strings of consecutive literals or consecutive match codes and outputs a count value indicating the number of consecutive literal or match codes rather than outputting a match or literal flag with each match or literal. In the preferred embodiment, the compression system is used in conjunction with a computer network, such as a Local Area Network (LAN) or a Wide Area Network (WAN). In the preferred network embodiment, the input stream is divided into packets of limited size and a coherency byte is appended to each compressed packet when forming the packets into frames to ensure that the frames are decompressed in the same order that the packets are compressed. If a packet cannot fit completely at the end of the history buffer after the preceding packets, the packet preferably is inserted at the beginning of the history buffer to avoid wrap-around problems.

Figure 1:
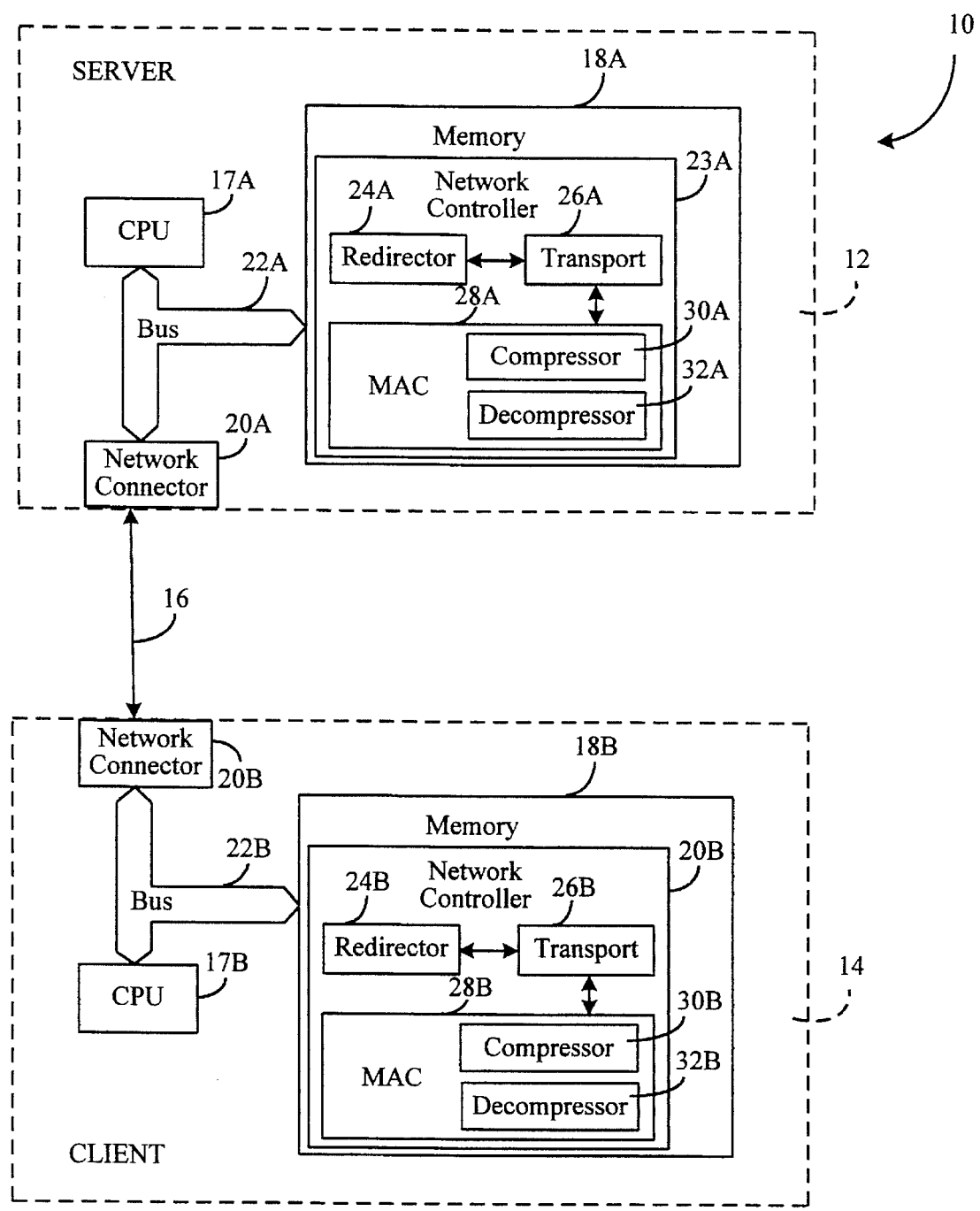
FIG. 1 is a block diagram of a data compression system according to the present invention.

FIG. 1 is an overview block diagram of a data compression system 10 according to the preferred embodiment of the present invention. The data compression system includes a server computer 12 coupled to a client computer 14 via a communications link 16 that carries compressed data between computers. The communications link 16 can be any link for passing data between computers, including a cable for a LAN or a telephone or satellite connection for a WAN. The server and client computers each include a central processing unit (CPU) 17A, 17B, a memory 18A, 18B and a network connector 20A, 20B interconnected by a data bus 22A, 22B. The network connectors physically connect each computer to the communications link 16, e.g., a modem physically connects each computer to a telephone line. In alternate systems, a series of one or more computers may be physically connected over a variety of communications links with the data being routed across the communications links from one computer to another. Thus, the spirit of this data compression system is not limited to just two computers, or even two endpoints. There may be one or more computers connected across a communications link just as there may be more than one communications link connected to a computer.

Each memory 18A, 18B stores a network controller 23A, 23B that controls the data being sent across the communications link 16 via the network connectors 20A, 20B. Each network controller 23A, 23B includes a redirector server 24A, 24B coupled to a conventional transport 26A, 26B that is coupled to a media access controller (MAC)28A, 28B. The redirector interfaces with the CPU 16A, 16B and memory 18A, 18B to provide file input and output. The transports ensure reliable data communication between the server computer 12 and the client computer 14 and can be any conventional transports such as TCP/IP, IPX/SPX and NETBEUI. The transports also divide the data being transported between computers into packets of limited size, such as 1.5 kilobytes or less. Included in each packet is transport header that includes an address of the computer sending the data and an address of the computer intended to receive the data. The MACs are responsible for synchronizing data transmission and adding frame headers to the packets to create frames for transmission between computers. The frame headers include bytes for synchronization, frame type, frame length, and a cyclic redundancy check (CRC). As is well known, a CRC is a value computed based on the data in the frame, which the receiving MAC uses to determine whether any data was lost or corrupted during transmission between computers. Each MAC includes a compressor 30A, 30B for compressing the packets before forming and sending the frames and a decompressor 32A, 32B for decompressing the frames.

Figure 2A:
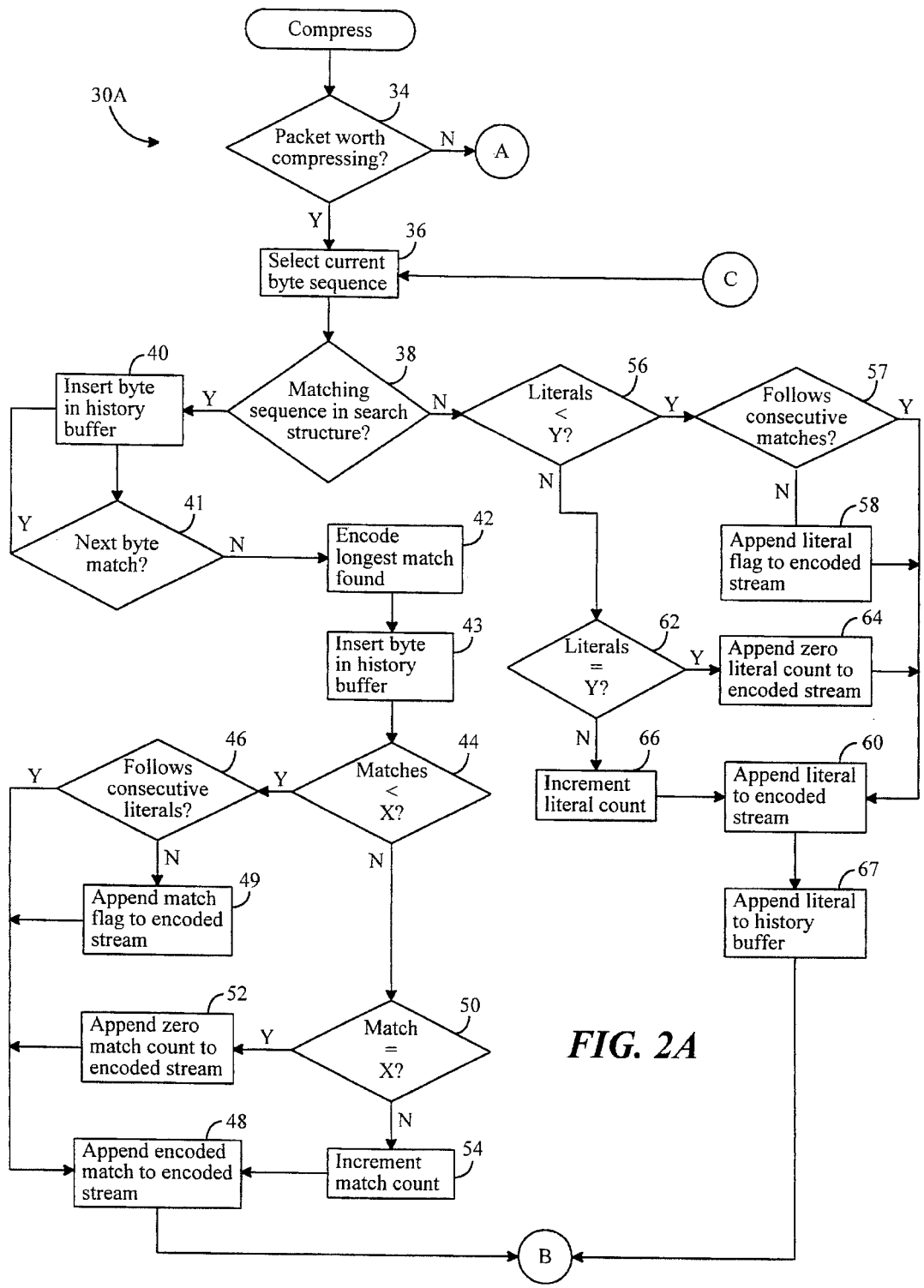
FIGS. 2A and 2B together are a flow diagram of a data compression method according to the present invention.
Figure 2B:
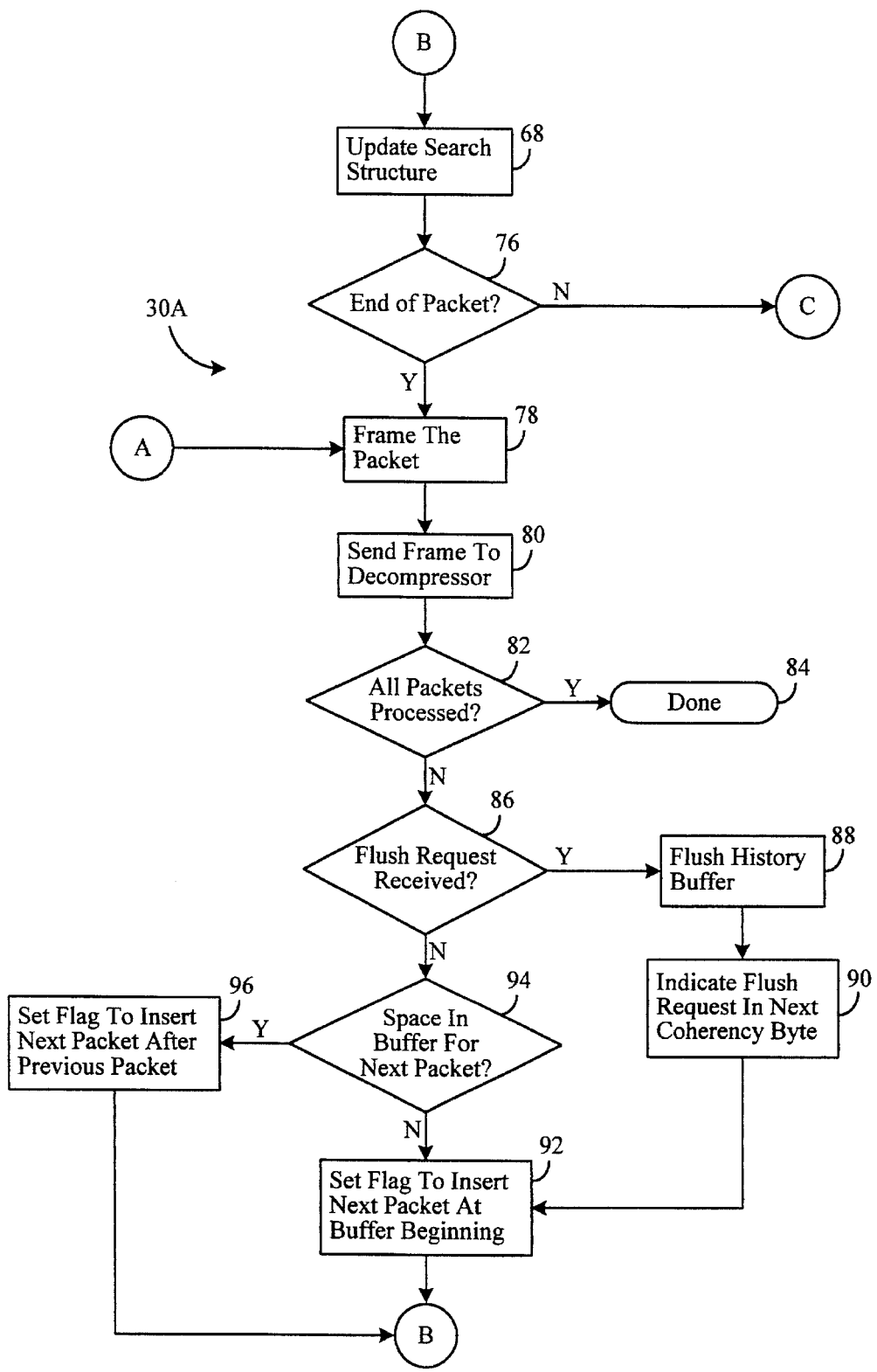

FIGS. 2A and 2B together constitute a flow diagram of the compression system 10 as controlled by the compressors 30A, 30B as shown in FIG. 1. The discussion that follows is directed to an example in which an input stream of data is being compressed in the server computer 12 into compressed frames and the compressed frames are passed to the client computer 14 where they are decompressed by the client computer 14. An identical flow occurs when an input stream is compressed in the client computer and passed to the server computer for decompression.

The input stream is stored in a transport buffer created in the memory 18A by the transport 26A. The compression system 10 begins by determining whether a first packet of the input stream is worth compressing (step 34). Small frames typically cannot be compressed to an extent that would justify the processing time and effort required to compress them. Furthermore, multicast and broadcast frames, in the preferred embodiment, are not compressed because these frames do not typically contain user data and may interfere with the current data stream of frames being transmitted or received. If the packet is not worth compressing then it is framed and output as an uncompressed frame, as described below.

If the patent is determined in step 34 to be worth compressing, then in step 36 the compression system selects a sequence of a limited number of bytes of the packet (preferably two bytes) as a current byte sequence. In step 38 the compression system determines whether a matching sequence can be found in a search data structure that stores byte sequences previously occurring in the input stream. The previously occurring byte sequences can be part of the same packet as the current byte sequence or part of a previously processed packet. If a matching sequence is found in the search structure, then in step 40 the first byte of the current byte sequence is inserted into a circular history buffer maintained in the memory 18A. The history buffer preferably is 8 kilobytes in size, but can be made larger for better compression or smaller for less memory consumption. In step 41, the bytes following the matching sequence in the history buffer is compared to the byte following the current byte sequence in an attempt to find a longer match.

If the byte following the current byte sequence matches the byte following the matching sequence, then in step 40 the second byte of the current byte sequence is inserted into the history buffer. Each time that a byte match is found, the matching sequence and the current byte sequence are augmented with the matching byte. Steps 40 and 41 are repeated until a byte following the current byte sequence does not match a corresponding byte following the matching sequence as determined in step 41. By inserting each successive byte into the history buffer in step 40 before the next bytes are compared in step 41, the compression system 10 allows the matching sequence to overlap the current byte sequence.

For example, assume that bytes A and B are stored in the history buffer at positions 1 and 2 and that the next three bytes of the input stream are A, B, and A. In step 38, the compression system 10 finds the sequence AB in the history buffer to match the AB in the current byte sequence of the input stream. In step 40, the A of the current byte sequence is inserted into the history buffer following the matching sequence AB at position 3. In step 41, the compression system determines that the A following the current byte sequence matches the A that was just inserted into the history buffer. As a result, the matching sequence becomes ABA and the last A of the matching sequence (position 3) is the same as the first A of the current byte sequence, so the sequences have overlapped. If the first A of the current byte sequence had not been inserted into the history buffer in step 40 before the next comparison was made in step 41 then the ABA matching sequence could not have been found.

If it is determined in step 41 that the next byte following the current byte sequence does not match the next byte following the matching sequence, then in step 42 the compression system encodes the longest match resulting from the byte-by-byte comparison of step 41. The encoding scheme used is preferably variable, that is, shorter matches are encoded with fewer bits than longer matches. Such variable encoding schemes are well-known, examples of which can be found in Bell, A Unifying Theory and Improvements for Existing Approaches to Text Compression, Ph.D. Thesis, University of Canterbury, New Zealand, 1987, which is incorporated herein by reference. In step 43, the last byte of the matched current byte sequence is inserted into the history buffer.

In prior art compression systems, each encoded match is appended to an encoding data stream along with a match flag indicating that the following data represent an encoded match. The purpose of each match flag is to distinguish between an encoded match and a raw or literal byte that is output when no matching sequence is found. When there are several consecutive encoded matches, using a match flag between each encoded match is unnecessary. The preferred embodiment of the present invention replaces at least some of the unnecessary match flags with a count value indicating the number of match flags replaced. In the preferred embodiment, the amount of storage used to encode the match count is typically less than the amount of storage used to encode the match flags replaced by the match count.

Returning to the flow diagram shown in FIG. 2A, the compression system 10 determines whether the number of consecutive encoded matches has reached a predetermined value X (e.g., X equals 6 in the preferred embodiment) in step 44. If the number of consecutive matches is less than X, then the compression system appends a match flag to the encoded data stream in step 46 and appends the encoded match to the encoded stream in step 48. If the number of consecutive matches is not less than X than in step 50 the compression system determines whether the number of consecutive matches equals X. If so, then a match count of zero is appended to the encoded stream in step 52 and the encoded match is appended to the encoded stream in step 48. If the match value is greater than X, then in step 54, the compression system increments the match count that was most recently appended to the encoded stream. In step 48 the compression system appends the encoded match to the encoded stream immediately after the most recently encoded match.

In a preferred embodiment, five bits are reserved for each match count. With five bits, only 32 match count values are possible, so match counts from 0 to 31 are possible. If more than 31 matches follow the first x matches, then a second match count immediately follows the 31st match. As such, each successive string of 31 matches is followed by a new match count.

When no matching sequence is found for the current byte sequence, prior art compression systems output the first byte of the current byte sequence as a raw byte or literal together with a literal flag indicating that no matching sequence was found. Like the redundancy caused by consecutive matches, it is unnecessary and wasteful to include a literal flag with each literal of a string of literals. In the preferred embodiment, at least some of the literal flags are replaced by a literal count value indicating the number of literal flags replaced. In the preferred embodiment, the amount of storage used to encode the literal count typically is less than the amount of storage used to encode the literal flags replaced by the literal count.

Returning to the flow diagram of FIG. 2A, if a matching sequence is not found in the search structure for the current byte sequence in step 38, then the compression system determines whether the number of consecutive literals is less than a predetermined value Y (e.g., Y equals 6 in the preferred embodiment) in step 56. If so, then a literal flag is appended to the encoded stream in step 58 and the literal is appended to the encoded stream in step 60. If the number of consecutive literals is not less than Y as determined in step 56, then the compression system determines whether the number of consecutive literals equals Y in step 62. If so, then a literal count of zero is appended to the encoded stream in step 64 and the literal is appended to the encoded stream in step 60. If not, then the number of literals must be greater than Y, so the previously appended literal count is incremented in step 66 to reflect the number of consecutive literals exceeding Y. Like the match count, the preferred embodiment limits each literal count to 0–31(5 bits) and a new literal count follows each successive string of 31 literals. In step 60 the literal is appended to the encoded stream following the immediately previous literal. In step 67, each literal appended to the encoded stream in step 60 is appended to the history buffer to enable future matches of each literal.

The flow diagram continues on FIG. 28 in step 68 in which the search structure is updated to ensure that an entry in the search structure points to the most recent occurrence of a data byte. The updating step can be more easily understood in the context of the following example of the preferred search structure.

Figure 3:
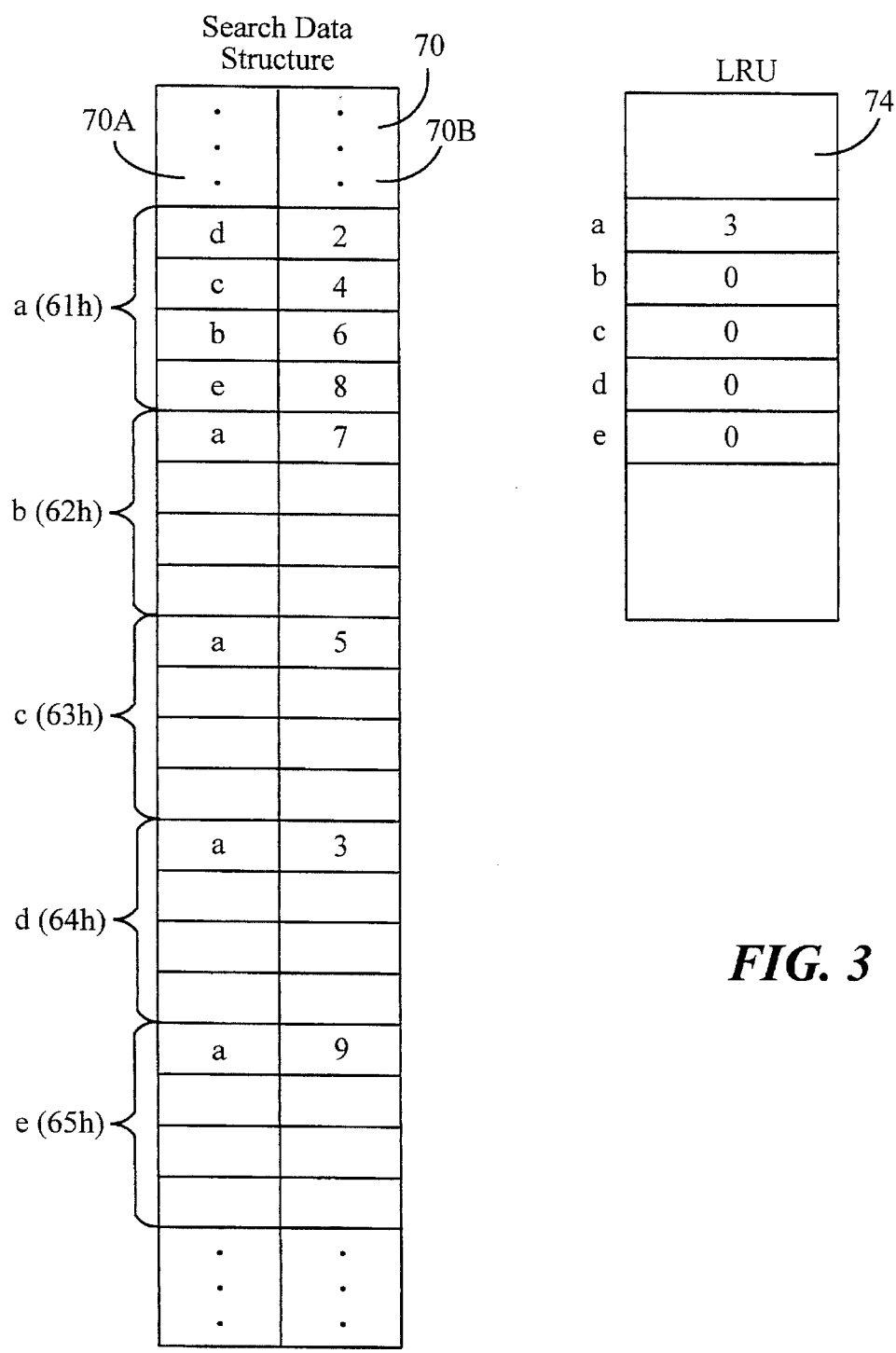
FIG. 3 is a block diagram of preferred search data structures used in the compression method shown in FIGS. 2A and 2B.

FIG. 3 is a block diagram illustrating a sample search data structure 70 in conjunction with a circular history buffer 72 in a preferred embodiment. The circular history buffer 72 contains one or more packets of an input stream of data bytes, which in the example are represented by letters. The number above each letter in the history buffer indicates the position of the letter within the history buffer. For example, the letter "f" is at the tenth position within the history buffer.

The search data structure 70 is a multi-dimensional direct address table that contains an entry for each possible byte-value. Thus, when a byte contains 8 bits, the table contains 256 entries. For example, the byte-value for an ASCII "a" is 61h. The entry indexed by 61h contains search information relating to byte sequences that begin with an ASCII "a" or byte-value 61h. Each entry contains a number of slots. A slot contains information that identifies a previous occurrence of a byte sequence in the history buffer. In the example of FIG. 3, each entry contains four slots. In a preferred embodiment, each entry contains eight slots. In an alternate embodiment, each entry has a variable number of slots based on the expected frequency of the byte-value in an input stream. One skilled in the art would appreciate that by using more slots, a greater amount of compression can be achieved, but generally at the expense of a greater time of compression. When an entry contains four slots, the search data structure can contain information for four byte sequences that begin with the indexed byte-value. Each slot contains a next byte field 70A and a position field 70B. The next byte field contains the byte-value of the next byte after the indexing byte. The position field contains the position of the next byte in the history buffer. One skilled in the art would appreciate that a next byte field is included to speed searching. The byte-value of the next byte could be obtained by using the position field as an index into the history buffer.

As shown in FIG. 3, the search data structure 70 contains information on the previous byte sequences when the current byte sequence starts at the ninth position in the history buffer as indicated by the arrow. The first eight bytes of the history buffer contain no matching byte sequences. The search data structure entry for "a" contains a slot that identifies each of the four previous byte sequences that begin with an "a", that is, "ad", "ac", "ab", and "ae." When the current byte sequence, "af" at positions 9 and 10, is processed, the search data structure 70 is searched to determine whether an "af" is identified as a previous byte sequence (step 38 of FIG. 2A). In this example, no slot for the entry indexed by "a" contains an "f" as the next byte-value. Consequently, the compression system overwrites the slot for the letter "a" that has been least recently updated. In this case, the slot identifying the byte sequence "ad" is replaced with information to identify the current byte sequence "af". Specifically, the next byte field is overwritten with an "f" and the position field is overwritten with a 10. When the next byte sequence beginning with an "a" is encountered, "ae" at position 11, the compression system searches for a slot in the entry indexed by "a" identifying a matching sequence, that is, a previous byte sequence "ae". Since the fourth slot contains an "e", a matching sequence is found. The fourth slot points to position 8 as the location of the last byte of the matching sequence ("e"). The compression system attempts to extend the matching sequence by comparing the byte at position 12 with the byte at position 9 and finds the matching sequence "aea"(step 40 of FIG. 2A). The compression system compares the byte at position 13 with the byte at position 10, but is unable to extend the matching sequence. The compression system encodes the current byte sequence "aea" as a match code including a pointer to the matching sequence "aea" beginning at position 7 and a count value of the length of the matching sequence for a match code representing (7, 3) (step 42 of FIG. 2A). After checking for repeated match codes (step 44), the compression system appends the match code and a match flag to the encoded stream (steps 46, 48). The compression system updates the search structure 70 by replacing the position in the fourth slot with position 12 to identify the current byte sequence (step 68).

An LRU (least-recently updated) data structure 74 contains an entry for each byte-value and is indexed by the byte-value. The entries identify the least recently updated slot for the corresponding entry in the search data structure. The LRU structure (as shown) actually contains the slot number (0 . . . 3) of the most recently updated slot. The least recently updated slot is obtained by adding 1 to the value in the LRU entry. For example, the least recently updated slot for "a" is slot 0; so the LRU data structure contains a 3 (3 +1mod 4 =0). When the current byte sequence does not match any byte sequence in the search data structure, the LRU is updated to point to the next slot (in a circular fashion) and the next slot is overwritten with the first byte and position of the current byte sequence. One skilled in the art would appreciate that an estimate of a least recently updated slot can be made by selecting the slot with the smallest position value and thus making the LRU data structure unnecessary.

In alternate embodiments, the byte sequence can be any number of bytes. The search data structure could be implemented as a direct access table indexed by two bytes and thus having $2^{16}$ entries. Alternatively, the search data structure could be implemented as a hash table. When a hash table is used, byte sequences with different first bytes could hash to the same entry causing a collision. When a collision occurs, the first byte of each byte sequence identified by a slot would need to be checked to determine a match. In another embodiment, the slots for each entry could be maintained as a linked list. The linked list could be implemented as an array parallel to the input stream with a slot for each byte in the input stream. Each entry in the search data structure would point to a linked list of slots identifying next byte values. The slots in the linked list would link together next byte values for the same first byte. When searching the linked list, only a certain number of slots are checked for a match. When no match is found, a new slot is added to the beginning of the linked list to identify the current byte sequence. When a matching slot is found, it is preferably removed from the linked list and a new slot added to the beginning of the linked list to identify the current byte sequence.

Returning to FIG. 2B, in step 76 the compression system 10 determines whether the end of the packet has been reached. If not, then the compression system loops through steps 36–68 with a new current byte sequence. If the most recent current byte sequence did not result in a match, then the new current byte sequence begins with the second byte of the previous current byte sequence. If the previous current byte sequence resulted in a match, then the current byte sequence begins with the first byte following the previous current byte sequence (as augmented by the matching bytes found in the byte-by-byte comparison of step 41).

Because the preferred embodiment of the compression system is used in conjunction with a network, there is a distinct possibility of losing all or part of the encoded frame during transmission from the server computer 12 to the client computer 14, especially when using a WAN. Prior art network compression systems have sought to alleviate the problem of dropped frames by providing a guaranteed delivery mechanism in the media access controllers (MACs) along with the compression programs. Such prior art schemes require the receiving MAC to transmit an acknowledgment back to the sending MAC after one or more frames is received. Such a delivery guarantee scheme wastes considerable transmission time and causes MACs to be unnecessarily complicated. In addition, the network transports already guarantee delivery, so the MAC delivery guarantee is redundant. As such, the transport may resend a frame while the media access controller is trying to do the same, so the frame may get sent twice.

Rather than having the MAC 28A include a delivery guarantee mechanism, the compression system 10 simply relies on the transports 26A, 26B to ensure delivery. This presents a problem in that each frame is compressed based on the data in the previous frames, but since the transport 26A sits above the MAC 28A there is no way for the transport to guarantee delivery from MAC 28A to MAC 28B, only from transport 26A to transport 26B. Thus, if no measures were taken, the decompressor would attempt to compress the subsequent frames, but because the dropped frame would not have gotten into the decompressor's history buffer, the decompressor would not be able to accurately decompress the subsequent frames. To compensate for this potential problem, the compression system 10 adds a coherency byte to each frame to ensure that the decompressor's history buffer remains synchronized with the compressor history buffer.

Returning to FIG. 2B, if the compression system 10 determines in step 76 that the end of a packet has been reached, the compression system frames the packet by adding a frame header, including a CRC and a coherency byte to form a frame in step 78. In step 80, the frame is sent to the decompressor 32B of the client computer across the communications link 16. In step 82, the compression system 10 determines whether all packets have been processed. If so, then the compression system is done and returns execution to whatever system caused the data to be sent between computers.

If there are more packets to process, the compression system 10 in step 86 determines whether a flush request has been received from the decompressor. Such a flush request is issued by the decompressor 32B if a frame is received out of order, as indicated by a nonsequential coherency byte, indicating that a frame was dropped during transmission. If such a flush request is received, then the compressor 30A in step 88 flushes its history buffer by invalidating the bytes currently in the history buffer. In step 90, the compression system sets the next coherency byte to indicate that a flush request has been received and that the frame to be sent with the coherency byte was compressed with a reset history buffer. In step 92, the compression system sets a flag to indicate that each byte of the next packet, after it is analyzed for a match, should be inserted at the beginning of the history buffer so that the next packet is compressed without reference to previous packets.

If no flush request is received in step 86, then in step 94 the compression system 10 determines whether there is sufficient space in the history buffer for the next packet after the immediately previous packet. If so, then in step 96 the compression system sets a flag indicating that each byte of the next packet, after it is analyzed for a match, should be inserted into the history buffer immediately after the previous packet. If not, then in step 92 the flag is set to indicate that each byte of the next packet, after it is analyzed for a match, should be inserted at the beginning of the history buffer. By inserting the next packet at the beginning of the buffer when it cannot entirely fit at the end of the buffer, the compression system avoids wrap-around problems associated with having a matching sequence continue from the end to the beginning of the history buffer. Such wrap-around problems include the necessity of constantly checking whether the end of the buffer has been reached during compression and decompression in order to remain within the history buffer. After inserting the next packet in the history buffer, the process continues to loop through steps 36–92 until all packets of the input stream have been processed.

Figure 4A:
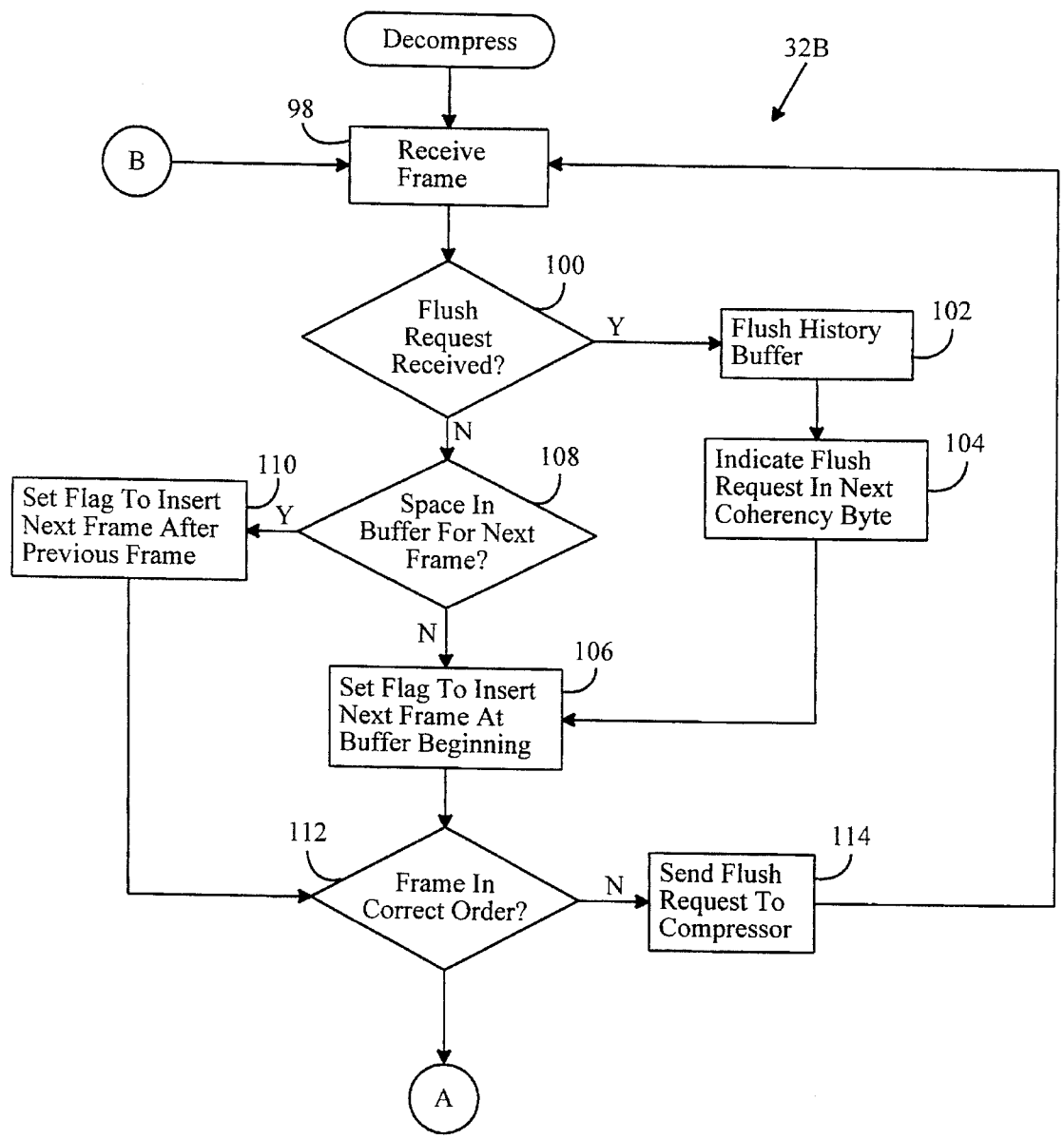
FIG. 4 is a flow diagram of a data decompression method using by the data compression system shown in FIG. 1.
Figure 4B:
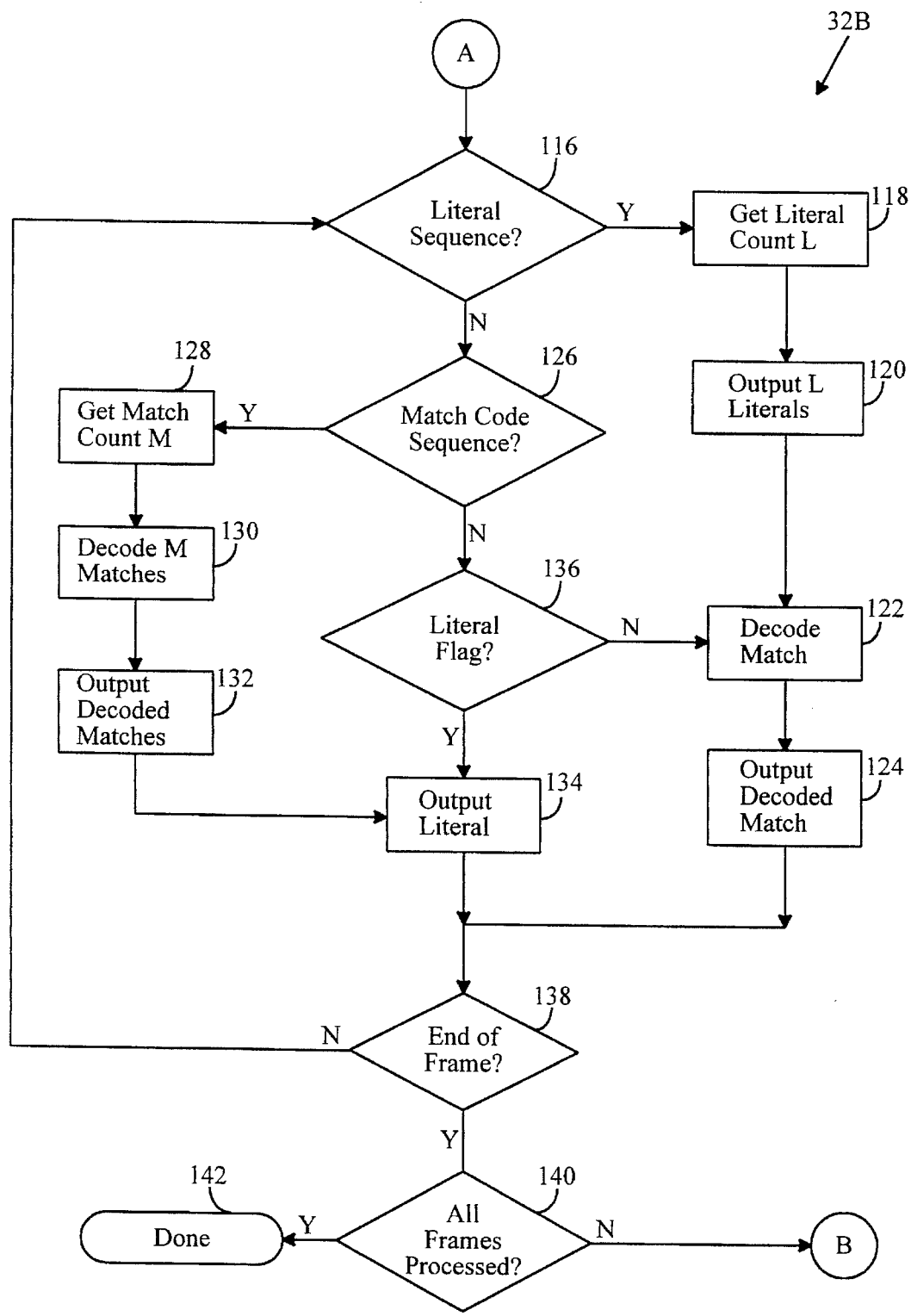

Shown in FIGS. 4A and 4B is a flow diagram of the decompression section of the compression system 10 as controlled by the decompressor 32B. In step 98, the decompressor 32B receives a frame from the compressor 30A. In step 100, the decompressor determines whether a flush request has been received from the compressor 30A. If such a flush request is received, then in step 102 the decompressor flushes its history buffer by invalidating the bytes currently in the history buffer. In step 104, the decompressor sets the next coherency byte to indicate that a flush request has been received and that the frame sent with the coherency byte was decompressed with a reset history buffer. In step 106, the decompressor sets a flag to indicate that each byte of the next frame, after it is decompressed, should be inserted at the beginning of the history buffer so that the next frame is decompressed without reference to previous frames.

If no flush request is received in step 100, then in step 108 the decompressor 32B determines whether there is sufficient space in the history buffer for the next frame after the immediately previous frame. If so, then in step 110 the decompressor sets a flag indicating that each byte of the next packet, after it is decompressed, should be inserted into the history buffer immediately after the previous frame. If not, then in step 106 the flag is set to indicate that each byte of the next packet, after it is decompressed, should be inserted at the beginning of the history buffer. Such buffer checking keeps the decompressor's history buffer in sync with the compressor's history buffer.

In step 112, the decompressor determines whether the frame received is in the correct sequential order by checking the sequence number of the coherency byte of the frame. If the sequence number is incorrect, then the decompressor determines that a frame has been dropped during transmission between the server computer 12 and the client computer 14. In step 114, the decompressor issues a flush request to the compressor which tells the compressor to reset its history buffer before compressing the next packet. The decompressor then returns to receive the next frame in step 98.

Figure 5:
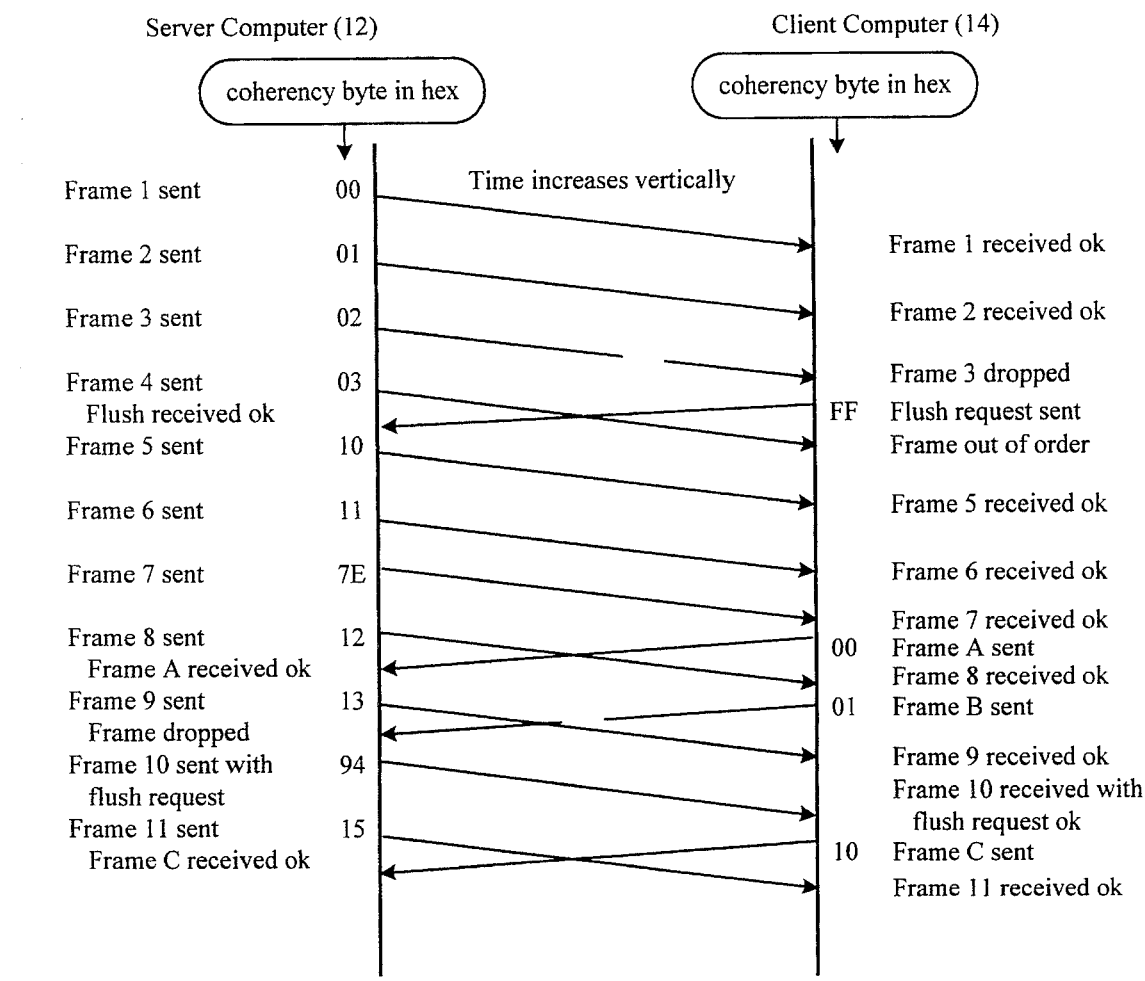
FIG. 5 is a time diagram illustrating a method of synchronizing history buffers used in the system shown in FIG. 1.

FIG. 5 is a time diagram illustrating an example of frames being transmitted between a server computer 12 and the client computer 14. Frames 1–4 are transmitted with sequential coherency bytes 00–03, respectively. Frames 1 and 2 are received with no mistakes by the client computer, but frame 3 is not received correctly by the client computer. The client computer may detect that a frame has been dropped by not receiving the frame within a specified time or receiving a frame but determining that the CRC did not match the data in the frame. In response to the dropped frame, the client computer transmits a flush request to the server computer by sending a control frame with a flush request coherency byte such as FF. Because of transmission delays, the flush request sent from the client computer is not received by the server computer until after the server computer has sent frame 4 to the client computer. As such, the client computer receives frame 4 with a coherency byte (03) that does not acknowledge that the server computer's compression history buffer has been flushed. As a result, the client computer determines that the frame 4 is out of order and does not decompress it. The server computer sends frame 5 with the upper nibble of the coherency byte changed to a 1 which indicates that the server's compression history buffer has been flushed and that frame 5 was compressed without referring to frames 1–4. When client computer receives frame 5 it recognizes the 1 in the upper nibble in the coherency byte as an indication of a buffer flush and the client computer decompresses frame 5 with its decompression history buffer flushed to match the server computer's flushed compression history buffer.

It should be recognized that the coherency bytes are not always in strict sequential order. As shown in FIG. 5, frame 7 is sent with a coherency byte of 7E rather than a coherency byte of 12 that would follow sequentially after the frame 6 coherency byte of 11. The coherency byte of 7E is reserved for frames that preferably are not compressed, such as small, multicast, and broadcast frames.

FIG. 5 also illustrates the ability of the preferred compression system to transmit frames from the server computer 12 to the client computer 14 while frames are being transmitted from the client computer to the server computer. The frames being sent to the client computer normally are processed separately from the frames being received by the server computer except when a frame is dropped. For example, the server computer determines that frame B has been dropped during transmission from the client computer to the server computer sometime before frame 10 has been sent. Rather than sending frame 10 with a sequential coherency byte of 14 and then sending a separate control frame with a flush request coherency byte, the server computer combines the frame 10 coherency byte with the flush request coherency byte to produce a coherency byte of 94. The client computer receives frame 10 and detects that frame 10 is in proper sequential order and that it has been coupled with a flush request. As a result, the client computer flushes its compression history buffer and transmits frame C along with a coherency byte of 10, the 1 in the upper nibble indicating that the buffer has been flushed and the 0 in the lower nibble indicating the start of a new numerical sequence of frames.

The decompression flow diagram continues with FIG. 4B, in which if a frame is received in the correct order, the decompressor determines whether it has already processed a sequence of a predetermined number (Y) of literals (Y equals 6 in the preferred embodiment) in step 116. If a sequence of literals was processed, then in step 118 the decompressor gets a count value (L) indicating the number of literals exceeding Y in the sequence of literals. In step 120 the decompressor outputs the next L bytes as literals. In step 122, the decompressor decodes the match immediately following the L literals. Recall that a match without a match flag always follows a string of literals, because if another literal followed the string of literals, then the literal would be part of the string of literals. In step 124, the decompressor outputs the decoded match.

If there was no sequence of literals of length Y, then in step 126 the decompressor determines whether there is a sequence of a predetermined number (X) of match codes (X equals 6 in preferred embodiment). If so, then in step 128 the decompressor obtains a count value (m) indicating the number of match codes greater than X in the sequence of match codes. In step 130 the decompressor decodes M consecutive match codes by searching for matching sequences in the decompression history buffer that is maintained identically to the compression history buffer of the server computer 12. Upon finding the beginning of each matching sequence in the decompression history buffer, the decompressor simply counts the number of bytes indicated by each encoding and outputs the decoded matches in step 132. In step 134, the decompressor outputs the literal immediately following the M matches.

If there are no sequences of match codes or literals, then the decompressor determines whether a literal flag is found in the next bit or bits (depending on the number of bits in each flag) in step 136. If so, then in step 134 the decompressor outputs a literal. If not, then the next bit or bits must be a match flag and in step 122 the decompressor decodes the match code following the match flag and outputs the decoded match in step 124.

After outputting literals or matches in steps 120, 124, 132, and 134, the decompressor determines whether the end of the current frame has been reached in step 138. If not, then the execution loops through steps 116–138 for the next section of the encoded frame. When the end of the frame is reached, the decompressor determines whether all frames have been processed (step 140). If there are more frames to receive, the decompressor loops through steps 98–140 for the next frame. When all the frames have been processed, the decompressor is done and returns execution to the operating system of the client computer in step 142.

As discussed above, the compression system 10 preferably inserts a new packet at the beginning of the history buffer when the new packet cannot fit at the end of the history buffer after the previous packet. In an alternate embodiment, only the portion of the new packet that does not fit in the end of the buffer is inserted into the beginning of the buffer. The compression system preallocates an extended buffer section that immediately follows the end of the history buffer. If a packet does not fit entirely into the history buffer, the portion of the packet that does not fit is inserted into the extended buffer section. This allows a current byte sequence occurring at the end of the history buffer to extend into the extended buffer section so that the compressor does not have to wrap-around to the beginning of the buffer while compressing a current byte sequence. The portion of the packet that extends into the extended buffer is then copied into the beginning of the history buffer for further compression after compression of that packet is completed.

Figure 6:
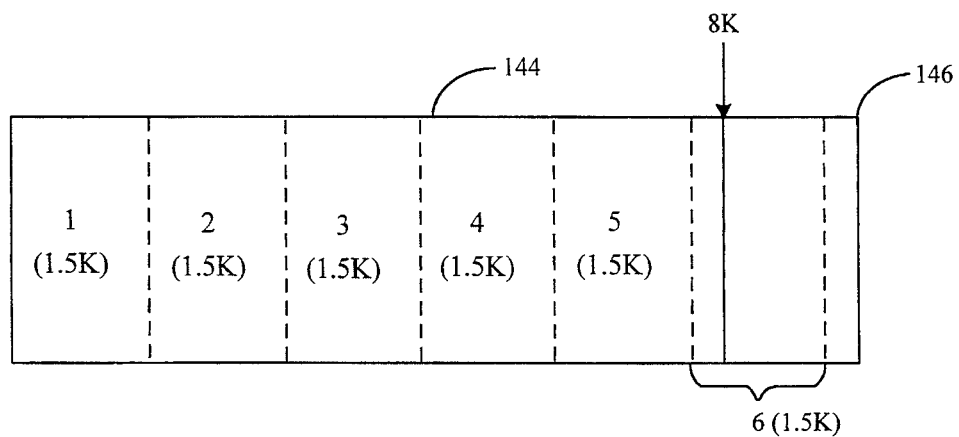
FIG. 6 is a block diagram of a data storage structure used in an alternative embodiment of the present invention.

An example of alternate embodiment shown with respect to the examples shown in FIG. 6. FIG. 6 shows an 8K circular history buffer 144 and a 1.5K extended buffer 146 located immediately after the end of the history buffer. Packets 1–5 have previously been inserted in the history buffer and compressed as described above. The next packet to be compressed is packet 6 which is 1.5K bytes in length. The compression system inserts the first 0.5K bytes of packet 6 into the history buffer immediately after packet 5 and inserts the remaining 1K of packet 6 into the extended buffer. Assume that the first 499 bytes of packet 6 are compressed normally as described above. As such, the current byte sequence begins with the last byte of the history buffer and extends into the extended buffer. The extended buffer allows the compression system to ignore the fact that the current byte sequence extends past the history buffer and allows the current byte sequence to be augmented as much as necessary if an extended matching sequence is found. For example, if a match is found for the current byte sequence extending from position 7999 (the last position in the history buffer) and 8004 and the match can be found and encoded without wrapping around to the beginning of the history buffer. Given that the next current byte sequence of packet 6 does not begin within the history buffer, the last 1K bytes of the packet 6 are inserted into the beginning of the history buffer, thereby overwriting the first 1K bytes of packet 1. Therefore, the next current byte sequence will begin within the history buffer with the byte at position 5 (the byte immediately following the end of the previous current byte sequence) and compression proceeds as normal.

From the foregoing it will be appreciated that, although specific embodiments of the invention have been described herein for purposes of illustration, various modifications may be made without deviating from the spirit and scope of the invention. Accordingly, the invention is not limited except as by the appended claims.

I claim:

1. A data compression method, comprising:

receiving an input stream of data bytes wherein the input stream is divided into packets having no more than m data bytes per packet;

inserting one or more packets in sequential order in a circular history buffer of size n, where n is greater than m;

inserting a packet of size x in the first x bytes of the history buffer when there are less than x bytes remaining at the end of the history buffer after the immediately previous packet is inserted in the history buffer;

searching for a matching string of already processed data bytes that is identical to a current string of bytes;

appending to an encoded data stream each data byte not forming part of such a matching string, such data byte being a literal; and appending to the encoded data stream a match code that identifies both the location in the input stream of the matching string and the number of data bytes in the matching string.

2. A data compression method, comprising:

receiving an input stream of data bytes wherein the input stream is divided into packets having no more than m data bytes per packet;

inserting one or more packets in sequential order in a circular history buffer of size n, where n is greater than m;

providing m-1 bytes of overflow storage space immediately after the end of the history buffer;

inserting y bytes of a packet of x bytes into the history buffer when there are y bytes of space remaining in the history buffer after the immediatel y previous packet is inserted in the history buffer;

inserting x-y bytes of the packet of x bytes into the overflow storage space; and copying the x-y bytes of the packet of x bytes into the first x-y bytes of the history buffer;

searching for a matching string of already processed data bytes that is identical to a current string of bytes;

appending to an encoded data stream each data byte not forming part of such a matching string, such data byte being a literal; and appending to the encoded data stream a match code that identifies both the location in the history buffer of the matching string and the number of data bytes in the matching string.

3. A data compression method for compressing a sequence of input strings, comprising:

receiving the sequence of input strings;

for each of a plurality of input strings of the sequence of input strings:

storing the input string in a history buffer of a compression device;

encoding the input string based on one or more previously processed matching strings stored in the history buffer; and transmitting the encoded string to a remote decompression device;

receiving a flush request from the decompression device if the encoded string is not received correctly by the decompression device;

flushing the history buffer in response to the flush request, the flushing step making the input strings previously stored in the history buffer incapable of becoming part of a matching string;

encoding input strings after receiving the flush request without reference to any input strings encoded before receiving the flush request; and;

transmitting the encoded input strings to the decompression device.

4. The method according to claim 3, further comprising:

appending a coherency code to each encoded string, the coherency code including a control code indicating whether a flush request has been received and a sequential code indicating where within a sequence of encoded strings the encoded string is located.

5. The method according to claim 3, wherein each input string includes data bytes and the encoding step includes:

searching the history buffer for an already processed matching string that is identical to the input string;

appending to an encoded data stream each data byte not forming part of an identical string, such data byte being a literal;

appending to the encoded data stream a match code that identifies both the location in the history buffer of the matching string and the number of data bytes in the matching string; and identifying a sequence of a predetermined number of match codes in the encoded data stream and appending to the identified match code sequence a count value indicating the number of match codes in the identified match code sequence.

6. The method according to claim 5, further comprising:

appending a match code flag to the encoded data stream adjacent match codes not forming part of a match code sequence; and appending a match code flag to each match code sequence.

7. The method according to claim 5, further comprising:

transmitting the encoded data stream to the decompression device; and decompressing the encoded data stream into a decompressed stream identical to the sequence of input bytes.

8. The method according to claim 7 wherein the decompressing step includes:

locating a match count value;

decoding a number of match codes equal to the match count value; and appending the decoded match codes to the decompressed stream.

9. The method according to claim 3 wherein each input string includes data bytes and the sequence of input strings is divided into one or more packets having no more than m data bytes per packet, the method further comprising:

inserting one or more packets in sequential order in a circular history buffer of size n, where n is greater than m.

10. The method according to claim 9, further comprising:

inserting a packet of size x in the first x bytes of the history buffer when there are less than x bytes remaining at the end of the history buffer after the immediately previous packet is inserted in the history buffer.

11. The method according to claim 9, further comprising:

providing m-1 bytes of overflow storage space immediately after the end of the history buffer;

inserting y bytes of a packet of x bytes into the history buffer when there are y bytes of space remaining in the history buffer after the immediately previous packet is inserted in the history buffer;

inserting x-y bytes of the packet of x-bytes into the overflow storage space; and copying the x-y bytes of the packet of x bytes into the first x-y bytes of the history buffer.

12. The method according to claim 3 wherein each input string includes data bytes and the sequence of input strings is divided into one or more packets having no more than m data bytes per packet, the method further comprising:

determining whether a packet has fewer than a predetermined minimum number of data bytes; and transmitting the packet to the decompression device without searching for strings of identical data bytes if the packet is determined to have fewer than the predetermined minimum number of data bytes.

13. A data compression method, comprising:

receiving an input stream of data bytes;

searching for a matching string of already processed data bytes that is identical to a current string of data bytes;

appending to an encoded data stream each data byte not forming part of such a matching string, such data byte being a literal;

appending to the encoded data stream a match code that identifies both the location in the input stream of the matching string and the number of data bytes in the matching string; and identifying a sequence of match codes in the encoded data stream and appending to the identified match code sequence a count value indicating the number of match codes in the identified match code sequence.

14. The method according to claim 13, further comprising:

transmiting the encoded data stream to a remote decompression device; and decompressing the encoded data stream into a decompressed stream identical to the input stream.

15. The method according to claim 14 wherein the decompressing step includes:

locating a match count value;

decoding a number of match codes equal to the match count value; and appending the decoded match codes to the decompressed stream.

16. The method according to claim 13, further comprising:

appending a match code flag to each match code sequence.

17. The method according to claim 13 wherein the input stream is divided into one or more packets having no more than m data bytes per packet, the method further comprising:

determining whether a packet has fewer than a predetermined minimum number of data bytes; and appending the packet onto the encoded data stream without searching for sequences of identical data bytes if the packet is determined to have fewer than the predetermined minimum number of data bytes.

18. The method according to claim 13 wherein the step of identifying a sequence of match codes includes identifying a predetermined number of successive match codes and the count value indicates the number of match codes in the match code sequence following the predetermined number of successive match codes.

19. The method according to claim 24 wherein the step of appending a match code flag includes appending a match code flag to the encoded data stream adjacent each match code not foraging part of a match code sequence, only if the match code does not immediately following a sequence of literals.

20. A data compression method, comprising:

storing an input stream of data bytes in a circular history buffer of a compression device;

searching the history buffer for a matching string of already processed data bytes that is identical to a current string of bytes;

appending to an encoded data stream each data byte not forming part of an indentical string, such data byte being a literal;

appending to the encoded data stream a match code that identifies both the location in the history buffer of the matching string and the number of data bytes in the matching string;

dividing the encoded data stream into a plurality of frames;

appending a coherency code to each frame, the coherency code including an encoding code that indicates whether the frame is encoded and if the frame is encoded the coherency code includes a sequence number that indicates a position of the frame within a sequence of encoded frames;

transmitting each encoded frame to a remote decompression device having a circular history buffer for decompressing each encoded frame; and synchronizing the history buffer for the decompression device with the history buffer of the compression device using the coherency codes.

21. The method according to claim 20, further comprising:

transmitting a flush request from the decompression device to the compression device if an encoded frame is not received by the decompression device; and flushing the history buffer in response to the flush request, the flushing step making the previously processed bytes stored in the history buffer incapable of becoming part of a matching string.

22. The method according to claim 21 wherein one of the coherency codes includes a control code indicating whether a flush request has been received by the compression device.

23. The method according to claim 20, further comprising:

identifying a sequence of a predetermined number of match codes in the encoded data stream and appending to the identified match code sequence a count value indicating the number of match codes in the identified match code sequence.

24. The method according to claim 23, further comprising:

appending a match code flag to each match code sequence.

25. The method according to claim 23, further comprising:

transmitting the each encoded data stream to a remote decompression device; and decompressing the encoded data stream into a decompressed stream identical to the input stream.

26. The method according to claim 25 wherein the decompressing step includes:

locating a match count value;

decoding a number of match codes equal to the match count value; and appending the decoded match codes to the decompressed stream.

27. The method according to claim 20 wherein the input stream is divided into one or more packets having no more than m data bytes per packet, the method further comprising:

determining whether a packet has fewer than a predetermined minimum number of data bytes; and appending the packet onto the encoded data stream without searching for sequences of identical data bytes if the packet is determined to have fewer than the predetermined minimum number of data bytes.

28. A method in a computer system for storing an encoded stream of data, the encoded stream of data including a plurality of literals and matches, the method comprising the steps of:

for each literal in the encoded stream, storing the literal;

for each match that does not immediately follow a predefined minimum number of matches;
storing the match; and
storing an indication that the match is stored; and after a predefined number of matches in sequence have been stored,
storing an indication of the number of matches that follow in sequence; and
storing each of the matches that follows in sequence without storing an indication that the match is stored.

29. A method in a computer system for storing an encoded stream of data, the encoded stream of data including a plurality of literals and matches, the method comprising the steps of:

for each literal in the encoded stream, storing the literal;

for each match that is not part of a sequence of matches,
storing an indication that the match is not part of a sequence of matches, and
storing the match; and each sequence of matches:
storing an indication of the sequence;
storing an indication of the number of matches in the sequence; and
storing each match of the sequence.

30. The method of claim 29 wherein a sequence is a predefined minimum number of matches.

31. A method in a computer system for compressing an input data stream of bytes, the computer system having an input buffer for storing the bytes of the input data stream, the input buffer having a beginning and an end, the method comprising the steps of:

receiving a plurality of bytes of the input data stream;

determining whether there is enough space in the input buffer between a most recently stored byte in the input buffer and the end of the input buffer to store the received plurality of bytes;

when there is enough space in the input buffer, storing the received plurality of bytes between the most recently stored byte in the input buffer and the end of the input buffer;

when there is not enough space in the input buffer, storing the received plurality of bytes starting at the beginning of the input buffer;

searching the input buffer for a string of bytes that matches a current string of bytes; and encoding the current string of bytes as a reference to the string of bytes that matches the current string of bytes.

32. A method in a computer system for maintaining synchronization of a compression system with a decompression system, the compression system for encoding data with reference to previously encoded data, the method comprising the steps of:

under control of the compression system, generating a packet of encoded data; and transmitting the packet to the decompression system;

under the control of the decompression system,
when the transmitted packet is not correctly received, transmitting a flush request to the compression system;

under control of the compression system,
receiving the transmitted flush request; and
in response to receiving the transmitted flush request, generating a packet of encoded data without reference to any previously processed packet, the generated packet including a synchronization indicator; and
transmitting the generated packet to the decompression system; and under control of the decompression system,
when the transmitted packet with the synchronization indicator is received, decompressing the encoded data in the received packet without reference to any previously processed packet;

whereby the compression and decompression system maintain synchronization even though a packet is not correctly received by the decompression system.

33. A method in a computer system for transmitting compressed data from a compression device to a decompression device, comprising:

for each of a plurality of input strings,
  receiving the input string;
  encoding the received input string based on previously received input strings that match the received input string; and
  transmitting the encoded input string to the decompression device;
receiving an indication that one of the transmitted input strings was not correctly received by the decompression device; and
in response to receiving the indication, encoding subsequently received input strings only based on input strings received after receiving the indication so that the decompression device can decompress without reference to input strings that were incorrectly received.

34. A method in a computer system for decompressing an encoded stream of data, the encoded stream of data including a plurality of literals and matches, the method comprising the steps of:
  parsing the encoded stream of data into separate portions;
  determining whether a current portion of the parsed separate portions includes a match code count that indicates the number of matches in a sequence of matches; and
  if the current portion includes a match code count, then for each match of the sequence of matches, decoding the match into a sequence of values.

35. The method of claim 34, further comprising:
  if the current portion does not include a match code count, determining whether the current portion immediately follows a portion that includes a sequence of matches and a match code count that indicates the number of matches in the sequence of matches; and
  if the current portion immediately follows a portion that includes a match code count, then outputting a literal for the current portion.

36. The method of claim 34, further comprising:
  determining whether the current portion immediately follows a portion that includes a sequence of literals and a literal code count that indicates the number of literals in the sequence of literals; and
  if the current portion immediately follows a portion that includes a literal code count, then decoding the current portion as a match into a sequence of values.

37. A method in a computer system for decompressing encoded data received at a decompression device from a compression device, comprising:
  receiving a plurality of encoded strings from the compression device, each of the plurality of encoded strings being encoded based on input strings corresponding to previously received encoded strings;
  transmitting to the compression device an indication that one of the encoded strings was not correctly received by the decompression device;
  subsequently receiving encoded strings that were encoded by the compression device only based on input strings received after receiving the indication from the decompression device; and
  decompressing the subsequently received encoded strings without reference to input strings corresponding to encoded strings that were incorrectly received.

* * * * *

UNITED STATES PATENT AND TRADEMARK OFFICE
CERTIFICATE OF CORRECTION

PATENT NO. : 5,521,597
DATED : May 28, 1996
INVENTOR(S) : Thomas J. Dimitri

It is certified that error appears in the above-indentified patent and that said Letters Patent is hereby corrected as shown below:

In column 14, claim 2, line 8, please delete "immediatel y" and insert therefor --immediately--.

In column 14, claim 2, line 20, please delete "history buffer" and insert therefor --input stream--.

In column 15, claim 11, line 41, please delete "x-bytes" and insert therefor --x bytes--.

In column 16, claim 19, line 40, please delete "foraging" and insert therefor --forming--.

In column 18, claim 29, line 7, following "and", please insert --for--.

Signed and Sealed this

Twenty-fourth Day of June, 1997

Attest:

*Attesting Officer*

BRUCE LEHMAN

*Commissioner of Patents and Trademarks*